United States Patent
Iida (10) Patent No.: US 7,361,553 B2
(45) Date of Patent: Apr. 22, 2008

(54) SEMICONDUCTOR DEVICE MANUFACTURING METHOD

(75) Inventor: Izuo Iida, Tochigi (JP)

(73) Assignee: Sanyo Electric Co., Ltd., Osaka (JP)

( * ) Notice: Subject to any disclaimer, the term of this patent is extended or adjusted under 35 U.S.C. 154(b) by 34 days.

(21) Appl. No.: 11/543,982

(22) Filed: Oct. 6, 2006

(65) Prior Publication Data

US 2007/0082452 A1    Apr. 12, 2007

(30) Foreign Application Priority Data

Oct. 6, 2005    (JP) .............................. 2005-293477

(51) Int. Cl.
*H01L 21/336* (2006.01)

(52) U.S. Cl. ...................... 438/257; 438/201; 438/211; 438/264; 257/E21.179; 257/E21.68

(58) Field of Classification Search ................ 438/225; 257/E21.177, E21.179, E21.4, E21.432
See application file for complete search history.

(56) References Cited

U.S. PATENT DOCUMENTS

2002/0146883 A1*  10/2002  Furuhata ..................... 438/257

2007/0042539 A1*   2/2007  Jeong et al. ................. 438/201

FOREIGN PATENT DOCUMENTS

JP    11-111936 A    4/1999
JP    11-284083 A   10/1999

* cited by examiner

*Primary Examiner*—Michael Lebentritt
*Assistant Examiner*—Cheung Lee
(74) *Attorney, Agent, or Firm*—Morrison & Foerster LLP

(57) ABSTRACT

A memory transistor and a high breakdown voltage MOS transistor are easily formed on the same semiconductor substrate without changing the operational characteristics of the memory transistor. The process of forming the tunnel insulation film of the memory transistor and the process of forming the gate insulation film of the MOS transistor are performed separately. Concretely, an insulation film to be a part of the tunnel insulation film and a silicon nitride film are formed on the whole surface, and then the silicon nitride film in a MOS transistor formation region is selectively removed using a photoresist layer. Then, the MOS transistor formation region is selectively oxidized using the remaining silicon nitride film as an anti-oxidation mask to form the gate insulation film of the MOS transistor having a selected thickness.

7 Claims, 8 Drawing Sheets

SEMICONDUCTOR DEVICE MANUFACTURING METHOD

CROSS-REFERENCE OF THE INVENTION

This application claims priority from Japanese Patent Application No. 2005-293477, the content of which is incorporated herein by reference in its entirety.

BACKGROUND OF THE INVENTION

1. Field of the Invention

The invention relates to a semiconductor device manufacturing method, particularly, a method of manufacturing a semiconductor device where a split-gate type nonvolatile memory transistor and a MOS transistor are formed on the same substrate.

2. Description of the Related Art

In recent years, an electrically programmable and erasable read-only memory device (hereafter, referred to as EEPROM) has been broadly used as a flash memory, together with the expansion of its application field such as cellular phones or digital cameras.

The EEPROM stores binary or multivalued digital data depending on whether a predetermined amount of electric charge is accumulated in a floating gate, and reads out the digital data by detecting a conductance change in a channel region corresponding to the amount of the electric charge.

This EEPROM includes a stacked-gate type having a structure where a floating gate and a control gate are stacked in this order on a semiconductor substrate and a split-gate type having a structure where a floating gate and a control gate face the channel region of a semiconductor substrate.

Figure 6:
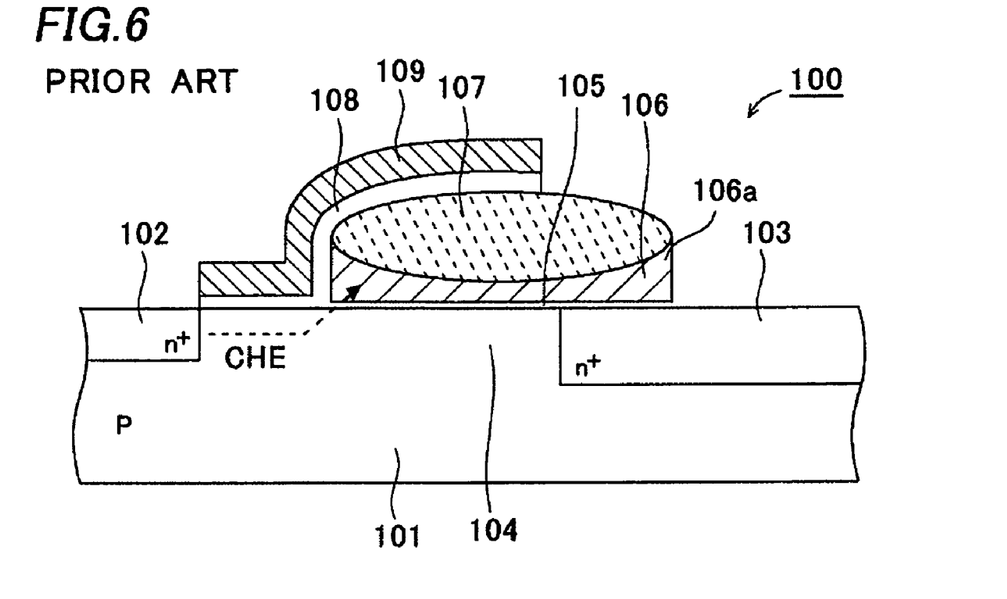
FIG. 6 is a cross-sectional view for explaining a memory cell of a split-gate type EEPROM of a conventional art.

FIG. 6 shows a cross-sectional view of a split-gate type memory transistor 100 as the general structure of the EEPROM.

Hereafter, the structure of the split-gate type memory transistor 100 will be described. An n+ type drain region 102 and an n+ type source region 103 are formed on the front surface of a P-type semiconductor substrate 101 at a predetermined distance from each other, and a channel region 104 is formed therebetween. A floating gate 106 is formed on a part of this channel region 104 and a part of the source region 103 with a gate insulation film 105 interposed therebetween. A thick silicon oxide film 107 is formed on the floating gate 106.

A tunnel insulation film 108 is formed so as to cover the side of the floating gate 106 and a portion of the upper surface of the silicon oxide film 107. A control gate 109 is formed on the tunnel insulation film 108 and a portion of the channel region 104.

The memory transistor of the split-gate type EEPROM is described in Japanese Patent Application Publication No. Hei 11-284083.

Processes for forming a nonvolatile memory transistor and a MOS transistor on the same semiconductor substrate are simplified as much as possible. For example, when the memory transistor and the MOS transistor are formed on the same semiconductor substrate, generally, an insulation film to be the tunnel insulation film of the memory transistor and an insulation film to be the gate insulation film of the MOS transistor are formed in the same process. This technology is described in Japanese Patent Application Publication No. Hei 11-111936.

It is necessary to provide desired performance to each of the memory transistor and the MOS transistor when these are formed on the same semiconductor substrate. Thus, taking account of the operational characteristics of the memory transistor (a threshold voltage or a memory current value), it is difficult to set the breakdown voltage of the MOS transistor to about 12V or more. In the conventional manufacturing method, as described above, the manufacturing the tunnel insulation film and the gate insulation film of the MOS transistor in the same process is desirable for the simplicity of the manufacturing process, but making the thickness of the gate insulation film large in order to provide the MOS transistor with a high breakdown voltage makes the thickness of the tunnel insulation film of the memory transistor too large, thereby degrading the operational characteristics of the memory cell. Concretely, the semiconductor device has a tunnel insulation film and a gate insulation film having a thicknesses of about 22 nm.

However, recently, the systems where the above described EEPROM is equipped on a logic IC, a microcomputer, or the like have been developed, and there is sometimes the case of providing a circuit operating at a higher power supply voltage (e.g. 25V) therein. Therefore, according to such a higher power supply voltage, there has been a need to form the MOS transistor having a higher breakdown voltage on the same semiconductor substrate.

SUMMARY OF THE INVENTION

The invention provides a method of easily forming a memory transistor and a high breakdown voltage MOS transistor on the same semiconductor substrate without changing the operational characteristics of the memory transistor.

The method of this invention includes providing a semiconductor substrate, forming a first insulation film on the substrate, forming on the first insulation film a stack of a floating gate and a selective oxidation insulation film disposed on the floating gate, forming a second insulation film on the first insulation film and the stack, forming an anti-oxidation film on the second insulation film, patterning the anti-oxidation film, thermally oxidizing the substrate using the patterned anti-oxidation film as a mask to form a third insulation film, patterning the second insulation film after the thermal oxidation, forming a nonvolatile memory that includes the stack and the patterned second insulation film as a tunnel insulation film, and forming a MOS transistor that includes the third insulation film as a gate insulation film.

BRIEF DESCRIPTION OF THE DRAWINGS

FIGS. 1A to 5 are cross-sectional views for explaining a method of manufacturing a semiconductor device of the invention.

DETAILED DESCRIPTION OF THE INVENTION

A method of manufacturing a semiconductor device of an embodiment of the invention will be described referring to figures. The following description is given on an example of the application of the invention to a method of manufacturing a semiconductor device made of a P-type semiconductor substrate, but it is possible to apply the invention to a method of manufacturing a semiconductor device made of a N-type semiconductor substrate. In FIGS. 1 to 5, a memory transistor formation region is formed on the left side and an N-channel type MOS transistor formation region is formed on the right side.

Figure 1A:
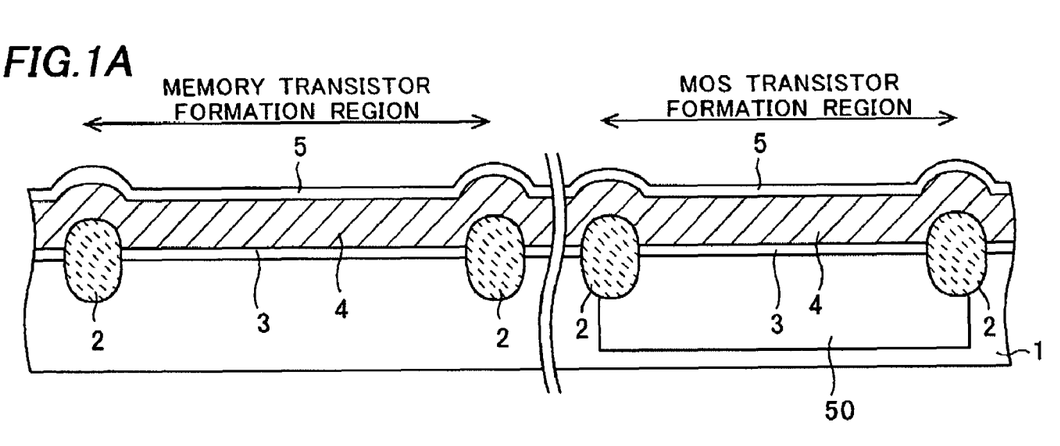

As shown in FIG. 1A, a P-type impurity (boron) is ion-implanted on the front surface of a P-type semiconductor substrate 1 in the MOS transistor formation region to form a P-type well 50. Then, field insulation films 2 having thicknesses about 500 nm are formed on the front surface of the semiconductor substrate 1 by a selective oxidation method, and element regions of the memory transistor formation region and the MOS transistor formation region are separated. This is the so-called LOCOS.

Then, an insulation film 3 (a first insulation film) made of an oxidation silicon film ($SiO_2$ film) having a thickness about 8 nm is formed on the front surface of the semiconductor substrate 1 by, for example, thermal oxidation. This insulation film 3 is to be a gate insulation film 8 of a memory transistor as described below.

Then, a polysilicon film 4 having a thickness of about 150 nm is formed on the whole surface of the P-type semiconductor substrate 1 by, for example, a CVD method. This polysilicon film 4 is to be a floating gate 7 of the memory transistor as described below. An amorphous silicon film can be used instead of the polysilicon film.

Then, a silicon nitride film 5 (a first silicon nitride film) having a thickness of about 80 nm is formed on the whole surface of the polysilicon film 4 by, for example, a CVD method. Then, the silicon nitride film 5 is selectively etched in a predetermined region, where the floating gate 7 is to be formed, using a photoresist layer (not shown) as a mask, to expose a portion of the polysilicon film 4.

Figure 1B:
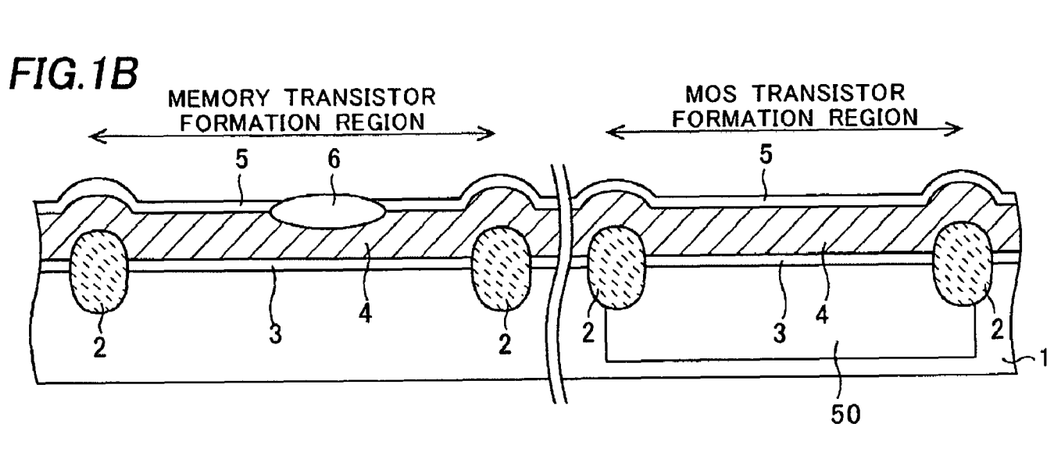

Then, the exposed portion of the polysilicon film 4 is selectively thermal-oxidized to form a selective oxidation insulation film 6 having a thickness of about 150 nm on the polysilicon film 4 as shown in FIG. 1B. At this time, the silicon nitride film 5 is used as an anti-oxidation mask. Thus, the front surface of the polysilicon film 4 covered by the silicon nitride film 5 is not oxidized.

The selective oxidation insulation film 6 is, for example, an oxidation silicon film, and thick at its center portion and thinning therefrom toward its end portion. Forming the center portion thick is for reducing capacitive coupling between the floating gate and the control gate of the memory transistor.

Figure 1C:
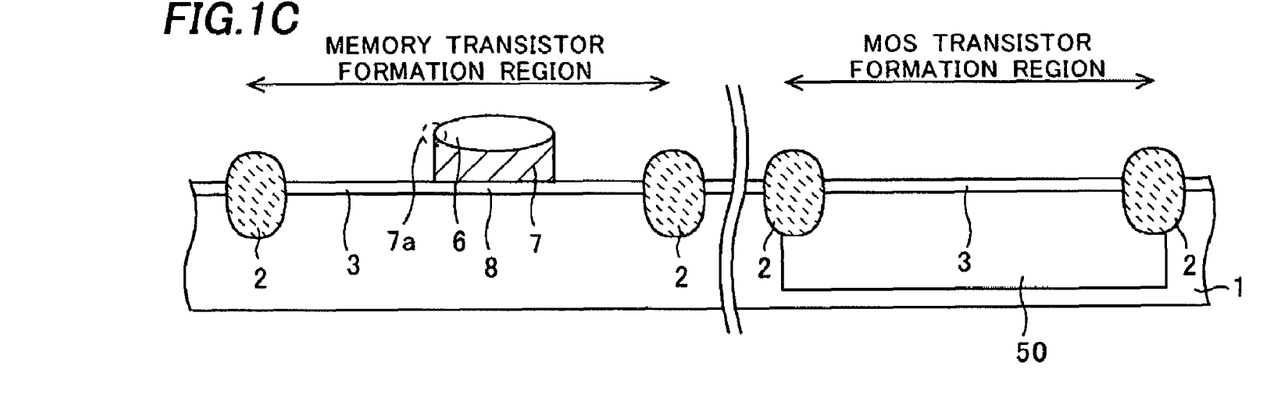

Then, the whole surface is etched using the selective oxidation insulation film 6 as a mask to selectively remove the silicon nitride film 5 and the polysilicon film 4 as shown in FIG. 1C. By this etching, the floating gate 7 of the memory transistor is formed under the selective oxidation insulation film 6 in a layered state. It is preferable to use an anisotropic etching method, for example, as the etching method of the polysilicon film 4 for obtaining a higher etching accuracy. In this case, a mixed gas of HBr and $Cl_2$ is used as an etching gas, for example.

As a result, the corner of the floating gate 7 is formed sharp (hereafter, called a sharp portion 7a). This makes a tunnel current from the floating gate 7 to the control gate flow easily as described below. The insulation film 3 under the floating gate 7 is the gate insulation film 8 of the memory transistor.

Figure 2A:
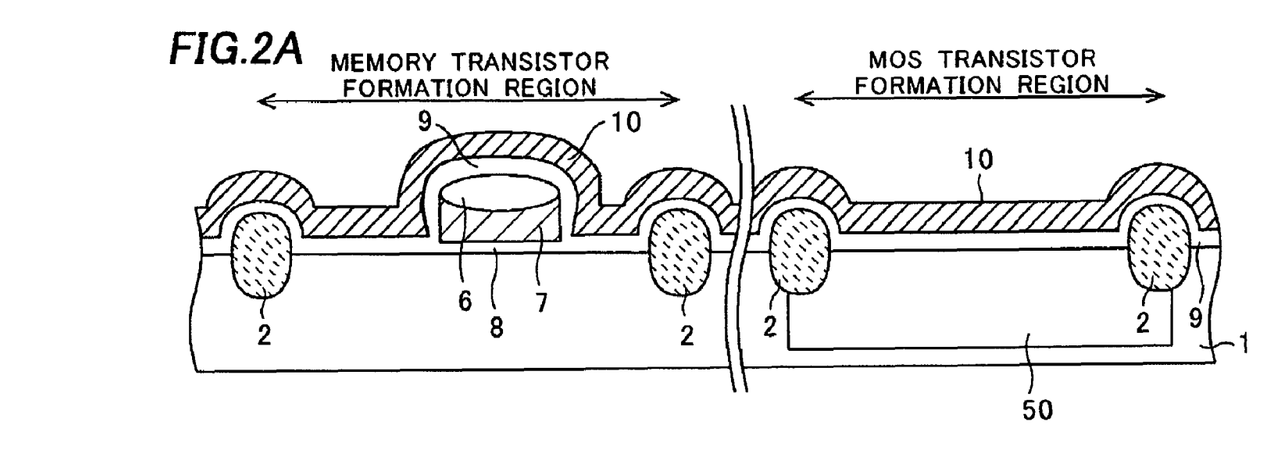

Next, as shown in FIG. 2A, an insulation film 9 (a second insulation film) having a thickness of about 15 nm is formed on the whole surface of the P-type semiconductor substrate 1 by, for example, a CVD method. This insulation film 9 is a HTO (high temperature oxide) film using, for example, monosilane or tetraethoxysilane, and is to be a tunnel insulation film 20 of the memory transistor as described below. This is also to be a portion of a gate insulation film 12 of the MOS transistor.

Sometimes the insulation film 9 formed on the front surface of the semiconductor substrate 1 and the insulation film 9 formed on the side of the floating gate 7 overlaps to form a shape sharpening toward the floating gate 7 side at the lower corner portion of the floating gate 7. It is possible that a thermal oxidation film having a thickness of about 8 nm is formed before the insulation film 9 is formed and this thermal oxidation film and the insulation film 9 form the tunnel insulation film 20 and a portion of the gate insulation film 12.

Figure 2B:
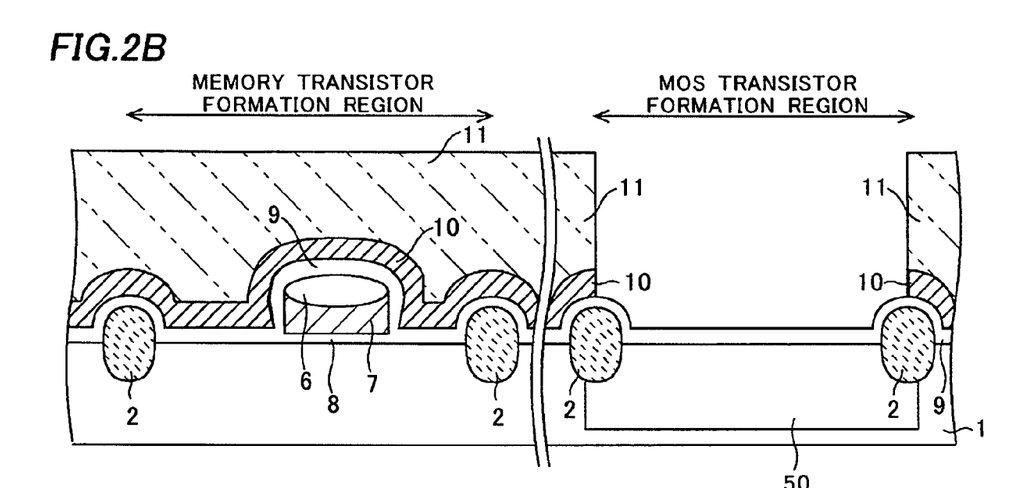

Then, a silicon nitride film 10 (a second silicon nitride film) having a thickness of about 20 nm is formed on the whole surface of the insulation film 9 by, for example, a CVD method. This silicon nitride film 10 is to be a sidewall insulation film 13 of the memory transistor, which prevents a reverse tunneling error as described below. Furthermore, the silicon nitride film 10 serves as an anti-oxidation mask for forming the gate insulation film 12 of the MOS transistor as described below Next, as shown in FIG. 2B, a photoresist layer 11 having an opening in the MOS transistor formation region is selectively formed by exposure and development. Then, the silicon nitride film 10 of the MOS transistor formation region is removed by etching using the photoresist layer 11 as a mask.

Figure 2C:
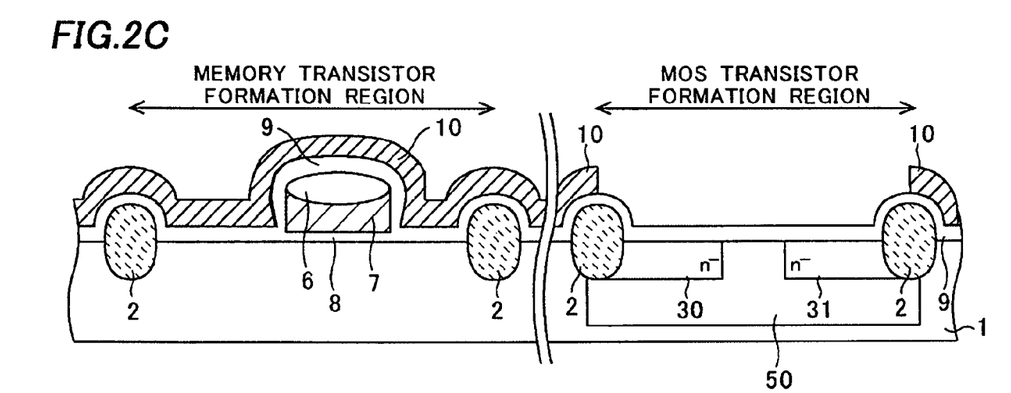

Next, as shown in FIG. 2C, the source region and the drain region of the MOS transistor are formed with the insulation film 9 of the MOS transistor formation region interposed therebetween by ion implantation and thermal diffusion. In detail, an N-type impurity, for example, phosphorus ion is ion-implanted using a photoresist layer (not shown) as a mask under an implantation condition of an acceleration voltage 80 KeV and a dose $1 \times 10^{13}/cm^2$. A low concentration (n−) drain region 30 and a low concentration (n−) source region 31 are formed by this process. Although the low concentration (n−) source and drain regions of the MOS transistor are formed in this step of this embodiment, it is possible to form the low concentration (n−) source and drain regions after the gate insulation film 12 is formed as described below.

Figure 3A:
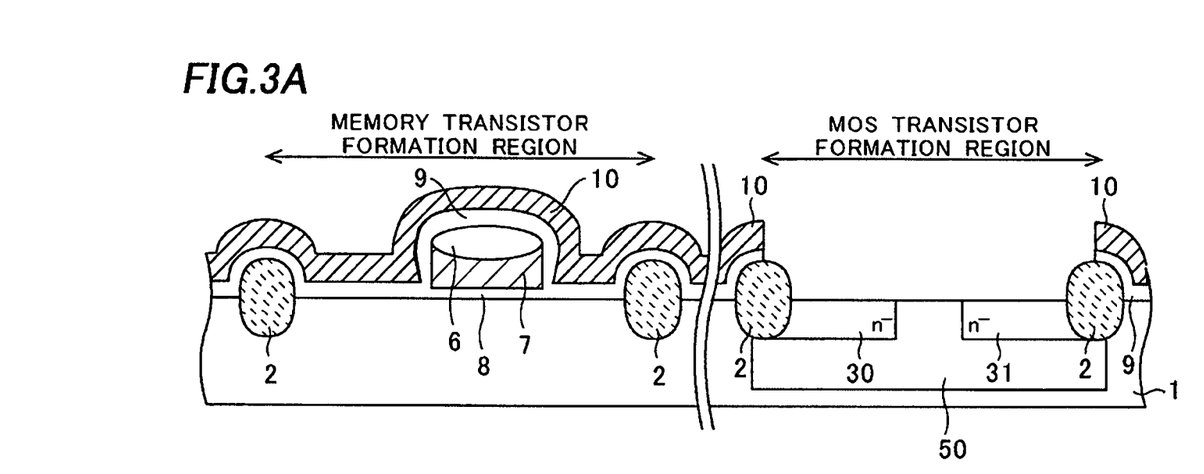

Next, as shown in FIG. 3A, the insulation film 9 of the MOS transistor formation region is removed by etching using the silicon nitride film 10 as a mask. It is also possible to use the insulation film 9 as a portion of the gate insulation film 12 without etching and removing the insulation film 9.

Figure 3B:
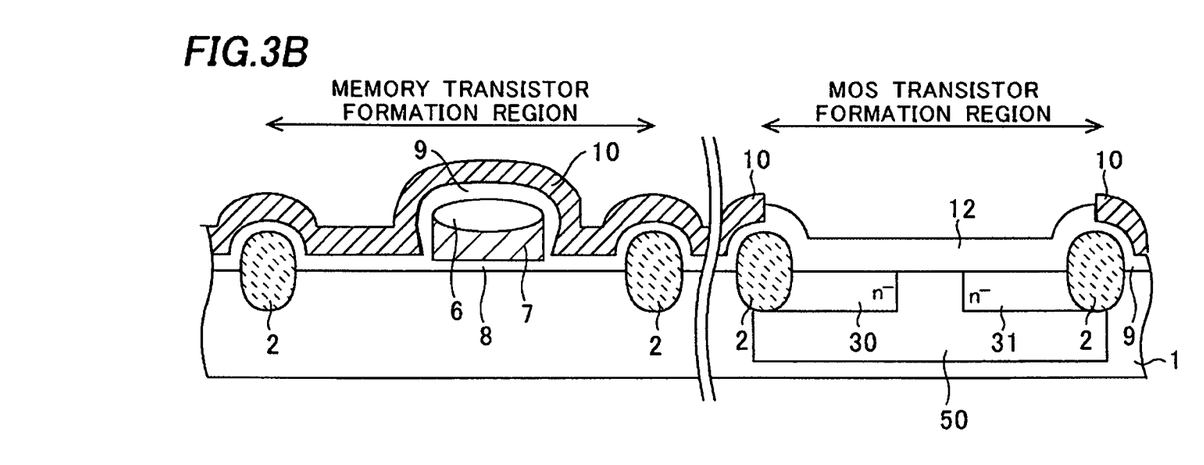

Next, as shown in FIG. 3B, using the silicon nitride film 10 as a mask, the gate insulation film 12 (a third insulation film and a selective oxidation insulation film) having a thickness of about 55 nm is formed on the P-type semiconductor substrate 1 of the MOS transistor formation region by, for example, a thermal oxidation method. At this time, the silicon nitride film 10 is used as an anti-oxidation mask in the memory transistor formation region. In the case where the insulation film 9 is removed before the thermal oxidation, the gate insulation film 12 has a single-layer structure. In the case where the insulation film 9 is not etched and removed as described above, the gate insulation film 12 has a layered structure of the insulation film 9 and the silicon oxide film of the selective oxidation insulation film formed in this process.

In this embodiment, in this manner, the process of forming the tunnel insulation film of the memory transistor and the process of forming the gate insulation film of the MOS transistor are performed separately. Therefore, the high breakdown voltage gate insulation film thicker than the tunnel insulation film can be easily formed. Furthermore, since the silicon nitride film 10 forming the sidewall insulation film 13 which is described below is used as the mask for forming the gate insulation film 12, the manufacturing process can be rationalized.

Figure 3C:
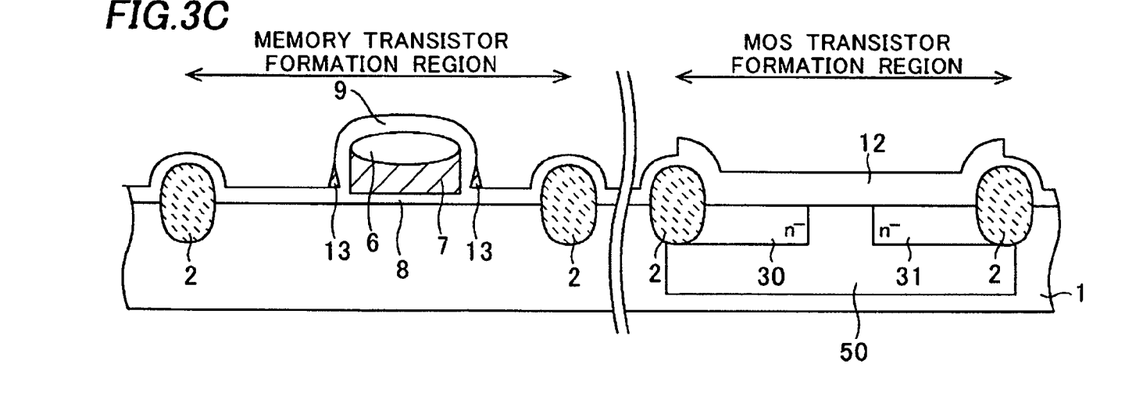

Next, as shown in FIG. 3C, the silicon nitride film 10 on the P-type semiconductor substrate 1 is removed by anisotropic etching. At this time, the silicon nitride film 10 covering the insulation film 9 near the lower portion of the floating gate 7 is left as it is. This remaining portion of the silicon nitride film 10 is the sidewall insulation film 13. It is appropriate that the height of the sidewall insulation film 13 is a half of the height of the floating gate 7, for example, about 25 nm, and the width is about 10 nm.

Figure 4A:
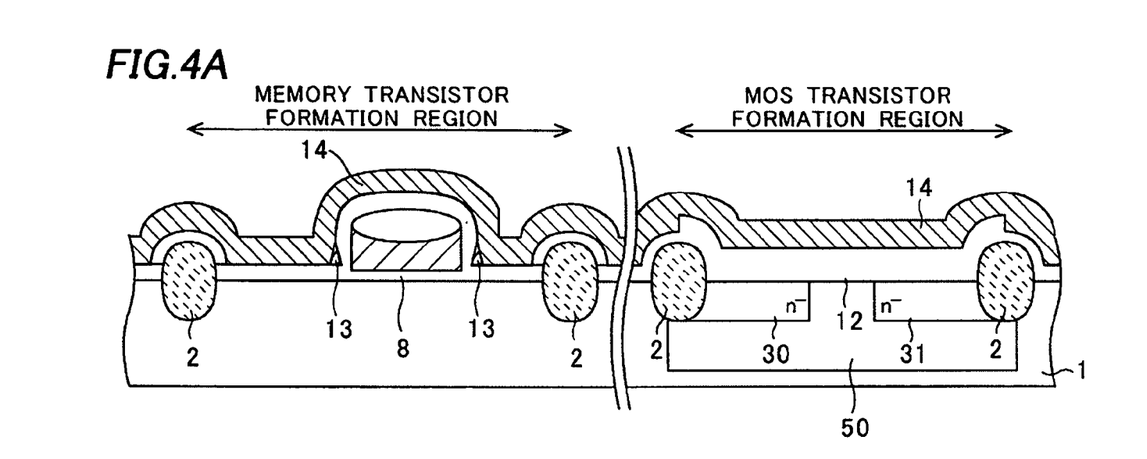

Next, as shown in FIG. 4A, a polysilicon film 14 (a second polysilicon film) having a thickness of about 100 nm is formed on the whole surface of the P-type semiconductor substrate 1 so as to cover the insulation film 9 and the sidewall insulation film 13 by, for example, a CVD method. It is possible to form a conductive film such as a polycide film instead of the polysilicon film.

Figure 4B:
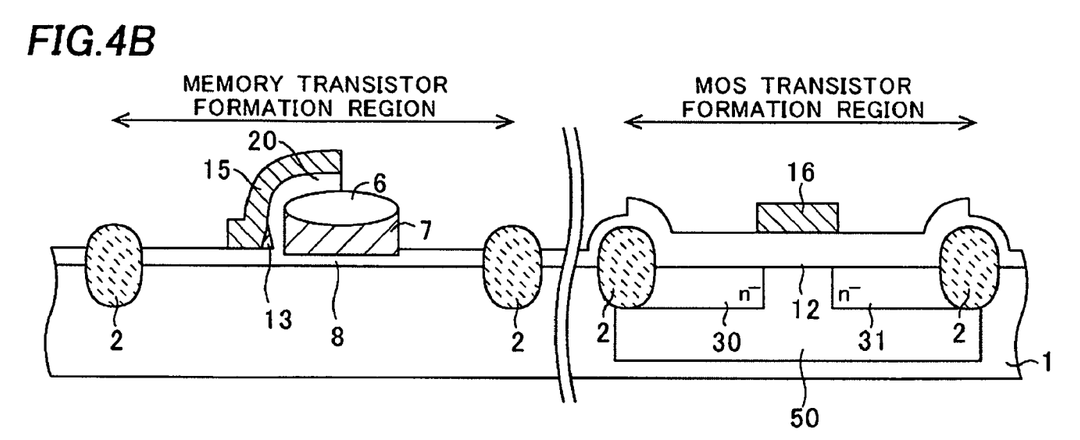

Next, as shown in FIG. 4B, the polysilicon film 14 is patterned using a photoresist layer (not shown) to form a control gate 15 in the memory transistor formation region and a gate electrode 16 in the MOS transistor formation region. Furthermore, the insulation film 9 covering the sidewall of the floating gate 7 and a portion of the selective oxidation insulation film 6 is patterned to form a tunnel insulation film 20. It is possible to omit this process of patterning the insulation film 9 and use the insulation film 9 as the tunnel insulation film 20 as it is.

Figure 4C:
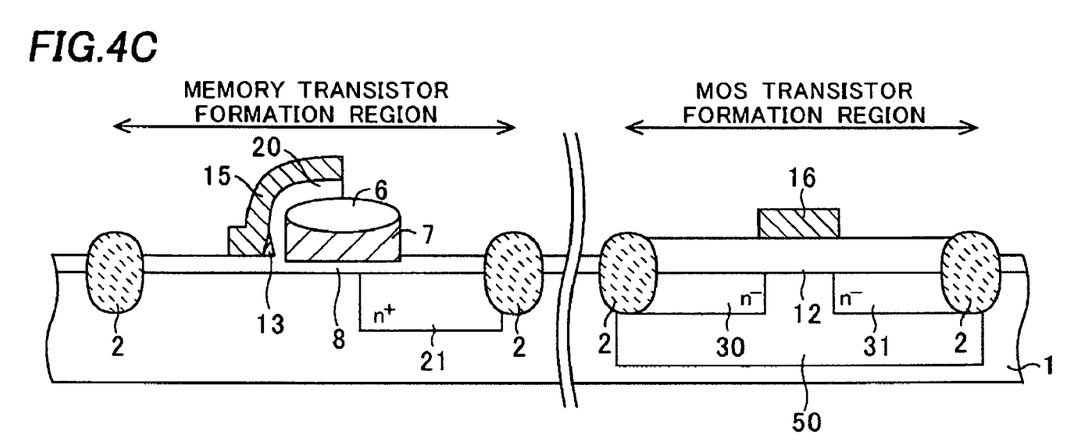

Then, an n-type impurity, for example, phosphorus ion is implanted on the front surface of the P-type semiconductor substrate 1 in the memory transistor formation region using a photoresist layer (not shown) as a mask under an implantation condition of an acceleration voltage 40 KeV and a dose $4 \times 10^{15}/cm^2$ as shown in FIG. 4C, and thermally diffused. By this process, a source region 21 is formed on an end portion of the floating gate 7, being self-aligned. It is possible to perform the implantation with arsenic ion instead of phosphorus ion under a desired condition for lowering the resistance of the source region 21.

Figure 5:
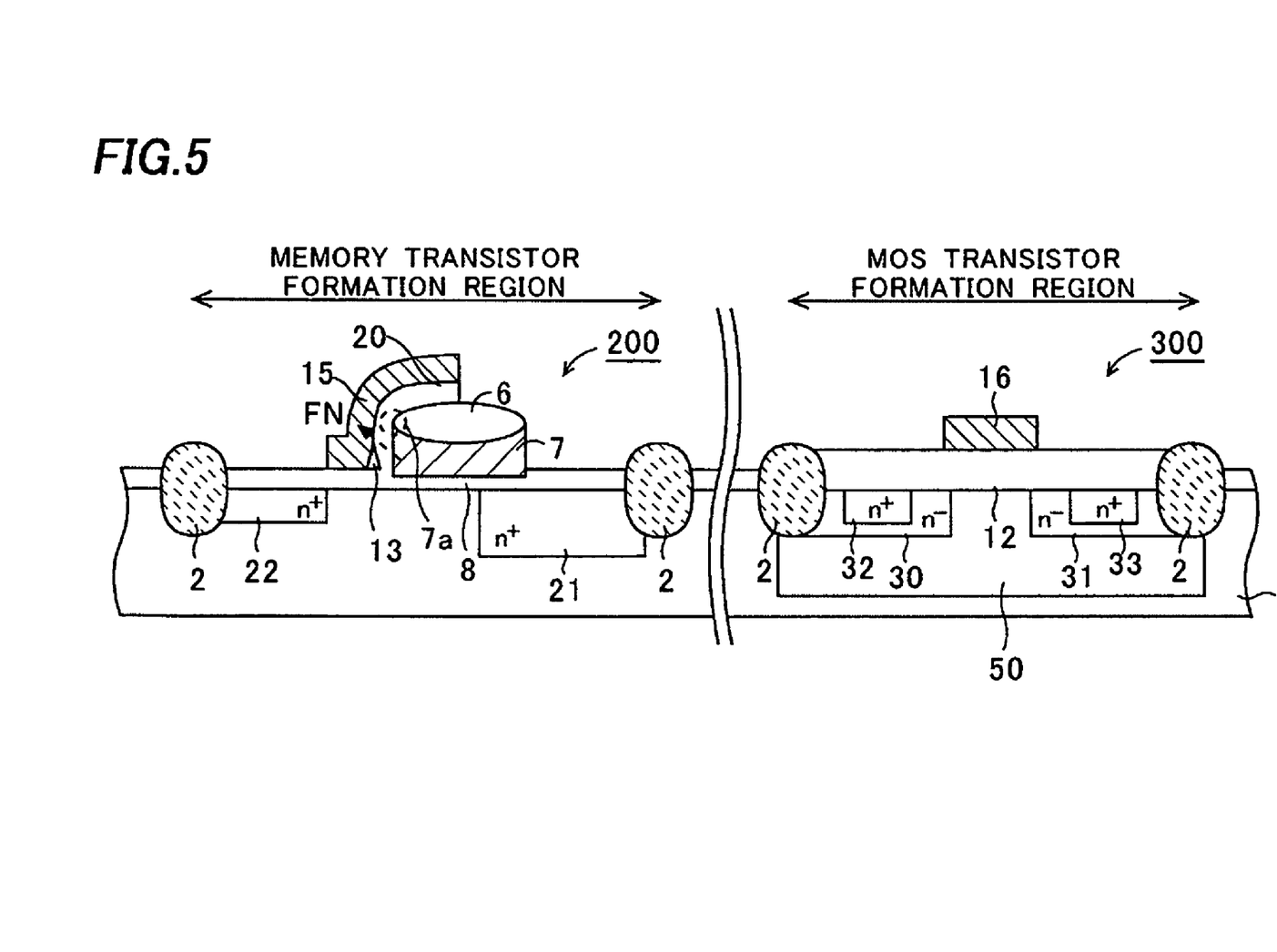

Next, as shown in FIG. 5, an n-type impurity, for example, arsenic ion is ion-implanted using a photoresist layer (not shown) as a mask under an implantation condition of an acceleration voltage 60 KeV and a dose $2 \times 10^{15}/cm^2$, and thermally diffused. By this process, a high concentration (n+) drain region 22 is formed in the memory transistor formation region, and a high concentration (n+) drain region 32 and a high concentration (n+) source region 33 are formed in the MOS transistor formation region.

By the above described processes, a memory transistor 200 is formed in the memory transistor formation region, and a high break down voltage MOS transistor 300 is formed in the MOS transistor formation region. Then, according to the usual manufacturing processes, an intended semiconductor device can be realized by forming a predetermined interlayer insulation film or a multiple layer wiring on the P-type semiconductor substrate 1.

In the semiconductor device of this embodiment, the tunnel insulation film 20 of the memory transistor 200 and the gate insulation film 12 of the MOS transistor 300 are formed in the different processes, so that each of those can have a selected thickness. Therefore, the semiconductor device satisfying both the required qualities of the memory cell transistor 200 and the MOS transistor 300 can be manufactured.

The above description does not mean that the above-described processes are necessarily performed in the order, at the temperature, under the ion-implantation condition described above. Therefore, the change of the order and the condition can be possible as long as similar effects are obtained.

Next, the operation of the memory transistor 200 having this structure will be described as follows. First, when digital data is to be written, channel hot electrons are injected to the floating gate 7 through the gate insulation film 8 by applying a predetermined potential (e.g. 0V to the P-type semiconductor substrate 1, 2V to the control gate 15, and 10V to the source region 21) to the control gate 15 and the source region 21 and flowing an electric current through the channel region. The channel hot electrons injected in the floating gate 7 are held by the floating gate 7 as electric charge.

At this time, the role of the selective oxidation insulation film 6 is to reduce the capacitive coupling between the control gate 15 and the floating gate 7. By this, the capacitive coupling between the floating gate 7 and the source region 21 becomes relatively larger than the capacitive coupling between the control gate 15 and the floating gate 7, so that the potential applied to the source region 21 makes the potential of the floating gate 7 increase to improve an injection efficiency of the channel hot electrons to the floating gate 7.

On the other hand, when the digital data stored in the memory transistor 200 is to be erased, a Fowler-Nordheim tunneling current is flown through the tunnel insulation film 20 by earthing the drain region 22 and the source region 21 and applying a predetermined potential (e.g. 3V) to the control gate 15, and the electrons accumulated in the floating gate 7 is taken out to the control gate 15. At this time, since the sharp portion 7a is formed at the end portion of the floating gate 7, electric field concentration occurs at this end portion, and the Fowler-Nordheim tunneling current can be flown at a relatively lower control gate potential, thereby performing effective data erasing.

When data stored the memory cell is to be read out, a predetermined potential (e.g. 2V) is applied to the control gate 15 and the drain region 22. Then, a channel current flows according to an electric charge amount of electrons accumulated in the floating gate 7, and this current is detected by a current sense amplifier, thereby performing the data reading. In this manner, in the memory transistor 200, binary or multivalued digital data is stored depending on whether or not an electric charge amount is accumulated in the floating gate 7, and the digital data can be read out by detecting a conductance change in the channel region corresponding to that electric charge amount.

Furthermore, in this structure, the sidewall insulation film 13 is formed on the tunnel insulation film 20 covering a portion near the lower portion of the floating gate 7, and further the control gate 15 is formed covering the sidewall insulation film 13. Therefore, the control gate 15 does not sharply enter the lower corner side of the floating gate 7, and the space between the floating gate 7 and the control gate 15 is not narrowed. Therefore, the invention provides a method of manufacturing a semiconductor device having a memory transistor which prevents a reverse tunneling error and minimizes an operation error in data writing. The reverse tunneling error is phenomenon where a potential difference between a floating gate and a control gate becomes large when a predetermined voltage is applied for data writing, electrons are discharged from a sharp portion of the control gate entering the floating gate side, and the electrons are mistakenly injected to the floating gate.

Although the description is given on the memory transistor 200 and the high breakdown voltage MOS transistor 300 formed in the memory transistor formation region and the high breakdown voltage MOS transistor formation region respectively in this embodiment, the semiconductor device of the invention also has a low breakdown voltage MOS transistor having a gate oxide film made of a thermal oxidation film having a thickness of about 7 to 12 nm and a middle breakdown voltage MOS transistor having the same thickness as that of the tunnel oxide film 20 together, and three types of gate oxide films having different thicknesses are formed for the low, middle, and high breakdown voltage MOS transistors.

This realizes the formation of the tunnel insulation film of the memory transistor and the gate insulation film of the MOS transistor with selected thicknesses respectively. Therefore, the memory transistor having desired characteristics and also the MOS transistor having a high breakdown voltage (e.g. 12V or more) can be formed on the same semiconductor substrate. Furthermore, the manufacturing method of this embodiment can also provide a semiconductor device which prevents a reverse tunneling error and minimizes an operational error in data writing.

What is claimed is:

1. A method of manufacturing a semiconductor device comprising a nonvolatile memory and a MOS transistor, comprising:
   providing a semiconductor substrate;
   forming a first insulation film on the substrate;
   forming on the first insulation film a stack of a floating gate and a selective oxidation insulation film disposed on the floating gate;
   forming a second insulation film on the first insulation film and the stack;
   forming an anti-oxidation film on the second insulation film;
   patterning the anti-oxidation film;
   thermally oxidizing the substrate using the patterned anti-oxidation film as a mask to form a third insulation film;
   patterning the second insulation film after the thermal oxidation;
   forming a nonvolatile memory that includes the stack and the patterned second insulation film as a tunnel insulation film; and
   forming a MOS transistor that includes the third insulation film as a gate insulation film.

2. The method of claim 1, further comprising removing the anti-oxidation film except for around a bottom edge of the floating gate after the thermal oxidation.

3. The method of claim 2, further comprising forming a conductive layer on the second and third insulation films.

4. The method of claim 1, wherein the anti-oxidation film comprises a silicon nitride film.

5. The method of claim 1, wherein the gate insulation film of the MOS transistor is thicker than the tunnel insulation film.

6. The method of claim 1, wherein the formation of the third insulation film comprises thermally oxidizing the substrate through the first and second insulation films.

7. The method of claim 1, wherein the formation of the third insulation film comprises removing the first and second insulation films and thereafter oxidizing the substrate.

* * * * *